(12) United States Patent
Chen et al.

(10) Patent No.: US 11,622,476 B2
(45) Date of Patent: *Apr. 4, 2023

(54) CIRCUIT BOARD ASSEMBLIES FOR ELECTRONIC DEVICES

(71) Applicant: Astec International Limited, Kowloon (HK)

(72) Inventors: Yu-Wei Chen, New Taipei (TW); Cheng-Sheng Chen, New Taipei (TW)

(73) Assignee: Astec International Limited, Kowloon (HK)

(*) Notice: Subject to any disclaimer, the term of this patent is extended or adjusted under 35 U.S.C. 154(b) by 0 days.

This patent is subject to a terminal disclaimer.

(21) Appl. No.: 17/446,346

(22) Filed: Aug. 30, 2021

(65) Prior Publication Data

US 2021/0392777 A1 Dec. 16, 2021

Related U.S. Application Data

(63) Continuation of application No. 16/723,237, filed on Dec. 20, 2019, now Pat. No. 11,134,591.

(51) Int. Cl.
| | | |
|---|---|---|
| *H04B 7/08* | (2006.01) | |
| *H04B 7/06* | (2006.01) | |
| *H05K 7/20* | (2006.01) | |
| *H05K 1/02* | (2006.01) | |

(Continued)

(52) U.S. Cl.
CPC .............. *H05K 7/209* (2013.01); *F28F 13/06* (2013.01); *H05K 1/0201* (2013.01); *H05K 1/181* (2013.01); *F28F 2215/08* (2013.01); *F28F 2250/10* (2013.01); *F28F 2275/00* (2013.01);

(Continued)

(58) Field of Classification Search
CPC ...... H05K 7/209; H05K 1/0201; H05K 1/181; H05K 2201/066; H05K 2201/1003; H05K 2201/10166; H05K 1/0209; H05K 2201/0311; H05K 2201/10393; H05K 2201/10606; H05K 3/301; F28F 13/06; F28F 2215/08; F28F 2250/10; F28F 2275/00; H01L 23/367; H01L 23/4093
See application file for complete search history.

(56) References Cited

U.S. PATENT DOCUMENTS

| | | |
|---|---|---|
| 4,899,255 A | 2/1990 | Case et al. |
| 5,109,318 A | 4/1992 | Funari et al. |
| 5,168,926 A | 12/1992 | Watson et al. |

(Continued)

FOREIGN PATENT DOCUMENTS

DE 102005012147 A1 * 5/2006 ......... H01L 23/4093

OTHER PUBLICATIONS

Baudelot Eric; Hofmann Lars; Leibold Herbert, "Thermal and mechanical mounting of an electronic circuit board has heatsink mounted in aperture in circuit board", May 11, 2006, Siemens AG, Entire Document (Translation of DE 102005012147). (Year: 2006).*

*Primary Examiner* — Stephen S Sul

(57) ABSTRACT

A circuit board assembly for electronic devices includes a circuit board having a first surface and a second surface opposite the first surface, and a heat sink carrier disposed on the first surface of the circuit board. The heat sink carrier includes at least one clamp portion. The assembly also includes a heat sink. The heat sink is positioned in the at least one clamp portion of the heat sink carrier to transfer heat from one or more electronic devices to the heat sink via the heat sink carrier.

19 Claims, 6 Drawing Sheets

(51) Int. Cl.
*H05K 1/18* (2006.01)
*F28F 13/06* (2006.01)

(52) U.S. Cl.
CPC ............... *H05K 2201/066* (2013.01); *H05K 2201/1003* (2013.01); *H05K 2201/10166* (2013.01)

(56) References Cited

U.S. PATENT DOCUMENTS

| | | | |
|---|---|---|---|
| 5,280,409 A * | 1/1994 | Selna | H01L 23/4006 361/720 |
| 5,343,362 A | 8/1994 | Solberg | |
| RE35,573 E | 7/1997 | Clemens | |
| 5,808,236 A * | 9/1998 | Brezina | H01L 23/4093 174/16.3 |
| 5,917,701 A | 6/1999 | Solberg | |
| 6,043,984 A | 3/2000 | Tseng | |
| 6,243,264 B1 | 6/2001 | Bollesen et al. | |
| 6,465,728 B1 | 10/2002 | McLaughlin et al. | |
| 6,816,375 B2 * | 11/2004 | Kalyandurg | G02F 1/133385 361/720 |
| 7,072,184 B2 * | 7/2006 | Kalyandurg | H01L 23/4093 315/32 |
| 7,137,440 B2 | 11/2006 | Hsu | |
| 7,474,529 B2 | 1/2009 | Tian et al. | |
| 7,719,842 B2 | 5/2010 | Kreissig et al. | |
| 7,746,653 B2 | 6/2010 | Negrut | |
| 7,983,048 B2 | 7/2011 | Sasaki et al. | |
| 8,213,180 B2 | 7/2012 | Zhao et al. | |
| 8,363,412 B2 | 1/2013 | Budai | |
| 8,780,563 B2 | 7/2014 | Lostoski | |
| 9,351,420 B2 * | 5/2016 | Busse | H05K 7/1432 |
| 11,134,591 B2 * | 9/2021 | Chen | H05K 1/0201 |
| 2004/0031586 A1 | 2/2004 | Rearick et al. | |
| 2004/0042177 A1 | 3/2004 | Geva et al. | |
| 2004/0112884 A1 | 6/2004 | Uhl et al. | |
| 2005/0264998 A1 | 12/2005 | McCutcheon et al. | |
| 2006/0164811 A1 | 7/2006 | Maxwell et al. | |
| 2007/0206361 A1 * | 9/2007 | Cheng | H01L 23/367 257/E23.102 |
| 2007/0211445 A1 * | 9/2007 | Robinson | H01L 23/552 361/818 |
| 2007/0263360 A1 | 11/2007 | Lai et al. | |
| 2008/0310119 A1 | 12/2008 | Giacoma | |
| 2009/0244851 A1 * | 10/2009 | Kuo | H01L 23/4093 361/720 |
| 2014/0036451 A1 * | 2/2014 | Simon | H01L 23/4093 361/720 |
| 2015/0208495 A1 | 7/2015 | Ma | |
| 2016/0106005 A1 * | 4/2016 | Ngyuen | H05K 7/20509 165/185 |
| 2017/0231113 A1 | 8/2017 | Anderl et al. | |
| 2018/0019186 A1 | 1/2018 | Kikugawa | |
| 2020/0111723 A1 * | 4/2020 | Bleske | H05K 7/2049 |

* cited by examiner

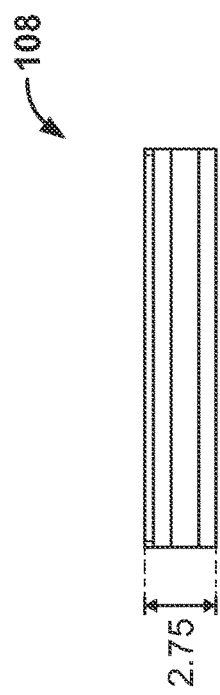
FIG. 5B
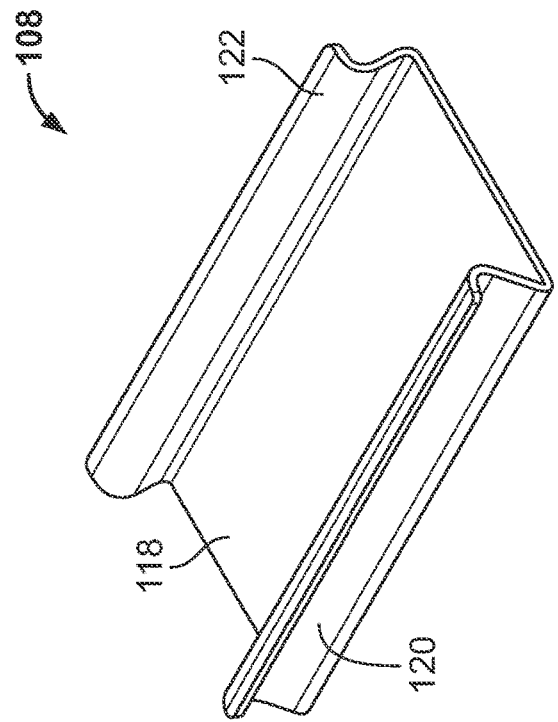
FIG. 5D
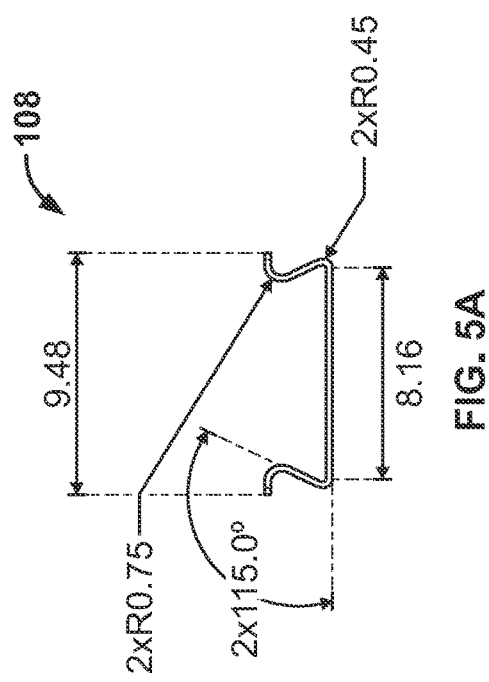
FIG. 5A
FIG. 5C

CIRCUIT BOARD ASSEMBLIES FOR ELECTRONIC DEVICES

CROSS-REFERENCE TO RELATED APPLICATIONS

This application claims the benefit of and priority to U.S. application Ser. No. 16/723,237 filed Dec. 20, 2019. The entire disclosure of the above application is incorporated herein by reference.

FIELD

The present disclosure relates to a circuit board assembly for electronic devices.

BACKGROUND

This section provides background information related to the present disclosure which is not necessarily prior art.

Circuit boards use different heat sink sizes to meet different models and customer requirements. Different airflow directions affect the placement of larger and smaller heat sinks on the board. Generally, each different circuit board model and airflow direction requires a separate heat sink mounting design and therefore separate circuit board assembly fabrication for each unique design.

SUMMARY

This section provides a general summary of the disclosure, and is not a comprehensive disclosure of its full scope or all of its features.

According to one aspect of the present disclosure, a circuit board assembly for electronic devices includes a circuit board having a first surface and a second surface opposite the first surface, and a heat sink carrier disposed on the first surface of the circuit board. The heat sink carrier includes at least one clamp portion. The assembly also includes a heat sink. The heat sink is positioned in the at least one clamp portion of the heat sink carrier to transfer heat from one or more electronic devices to the heat sink via the heat sink carrier.

According to another aspect of the present disclosure, a circuit board assembly for electronic devices includes a circuit board having a first surface and a second surface opposite the first surface, and a heat sink carrier disposed on the first surface of the circuit board. The heat sink carrier includes a base portion and two resilient arms. The base portion is positioned to contact the first surface of the circuit board, and the base portion includes two opposite edges. The two resilient arms are each located at a different one of the opposite edges. The assembly also includes a heat sink. The heat sink is coupled to the heat sink carrier without any fasteners or adhesives, to transfer heat from one or more electronic devices to the heat sink via the heat sink carrier.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 4A:
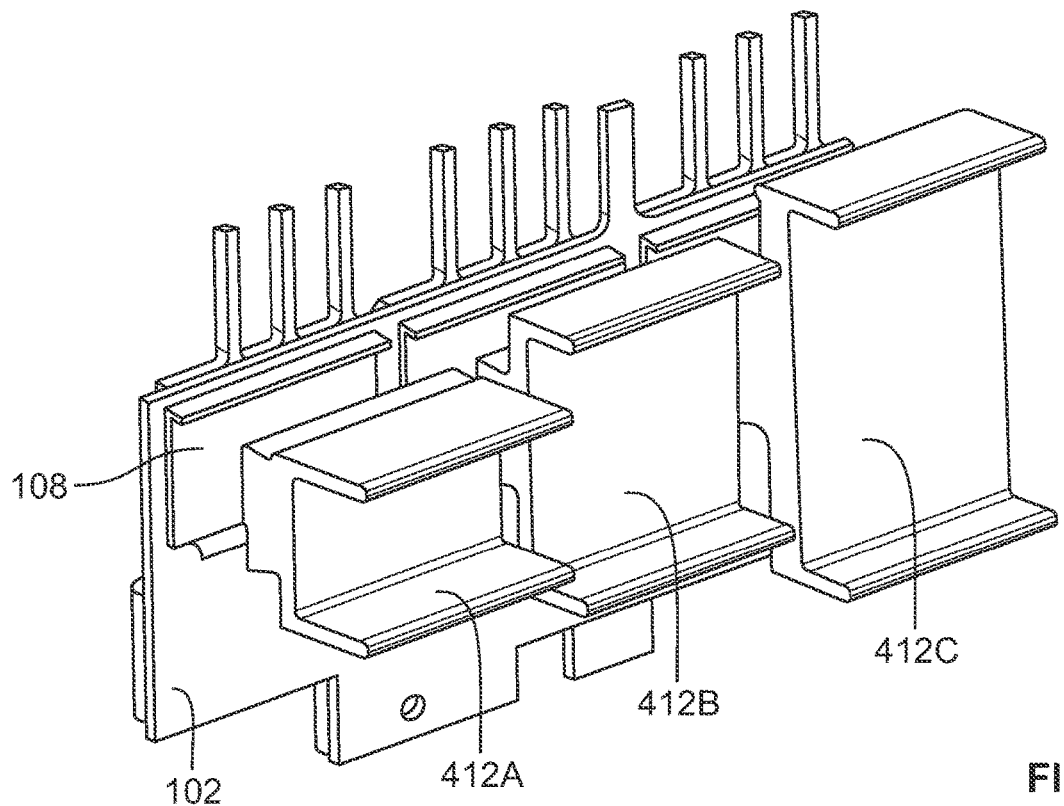
Figure 4B:
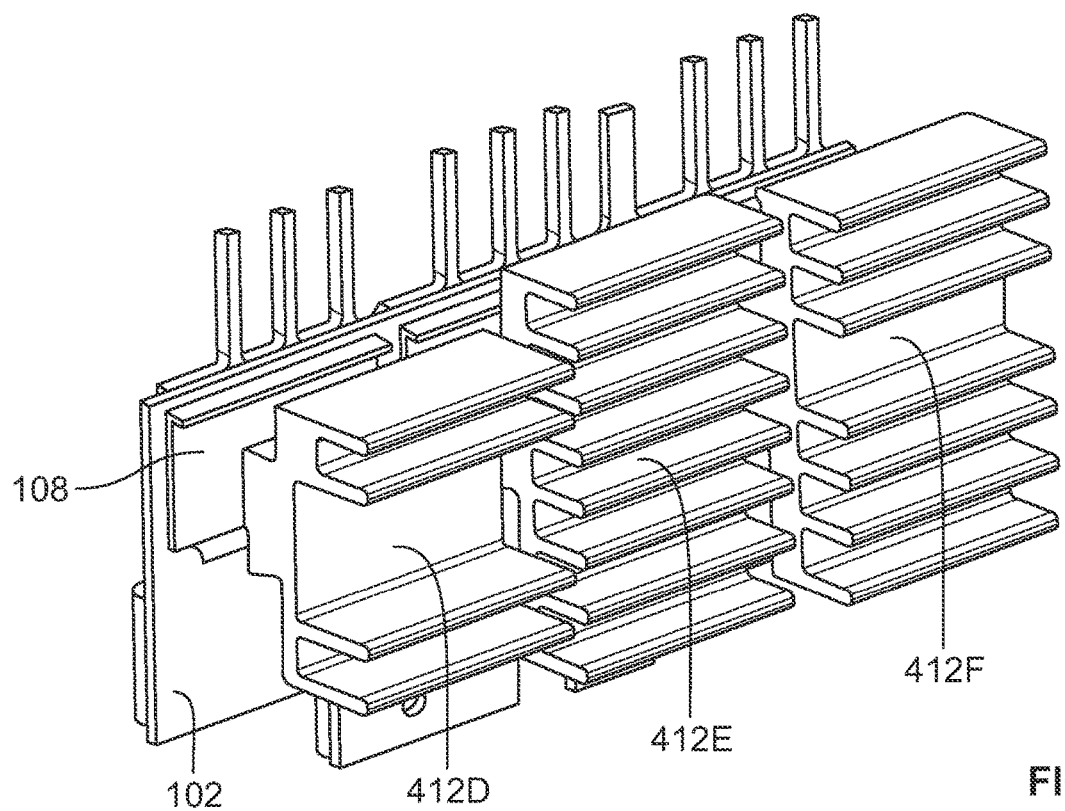
Figure 4C:
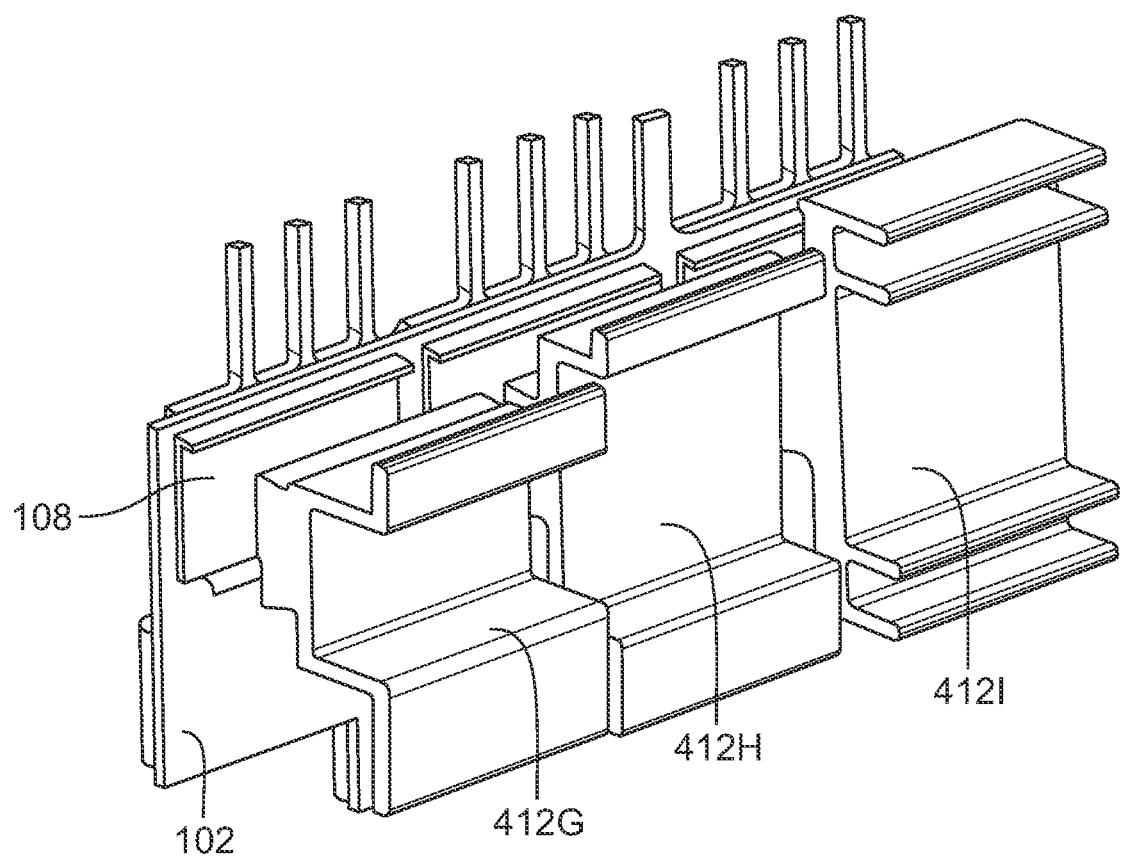

FIGS. 4A-C are orthogonal views of circuit board assemblies including different sized heat sinks.

Figure 1:
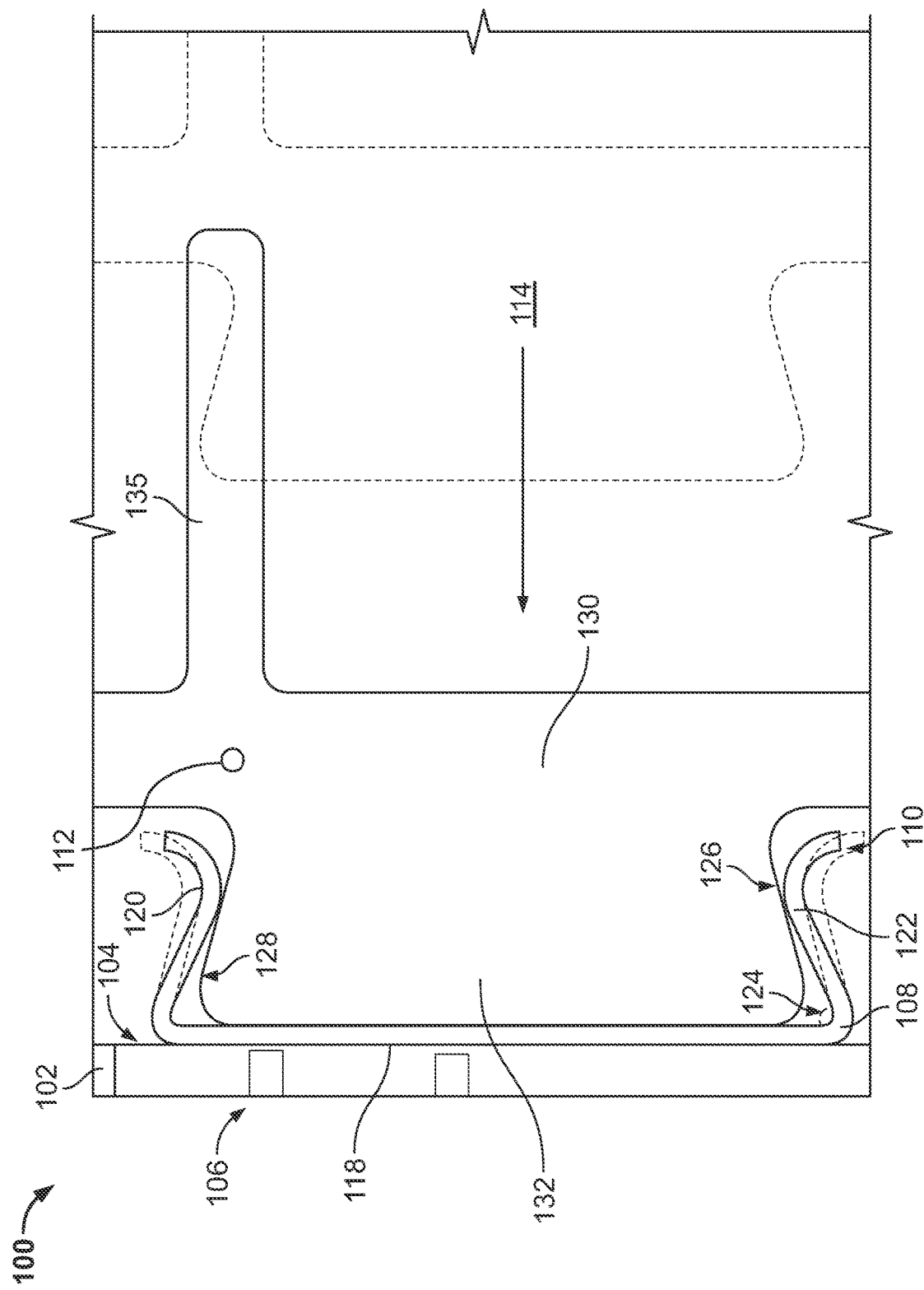
FIG. 1 is a side view of an example circuit board assembly, according to one example embodiment of the present disclosure.
Figure 2B:
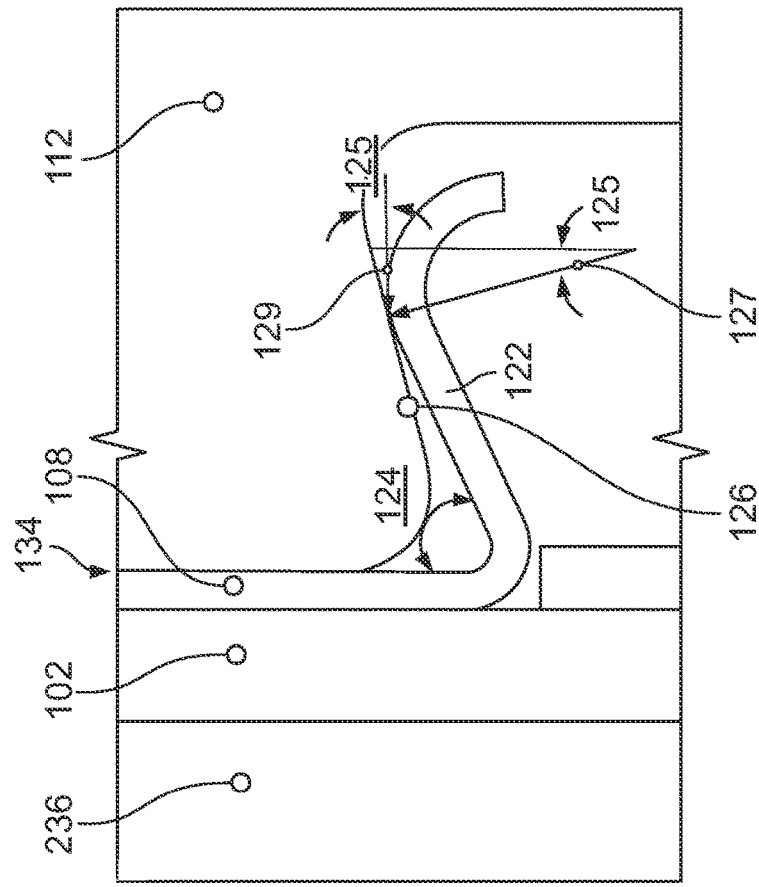
FIG. 2B is a cutout side view of FIG. 2A taken at A'.
Figure 2A:
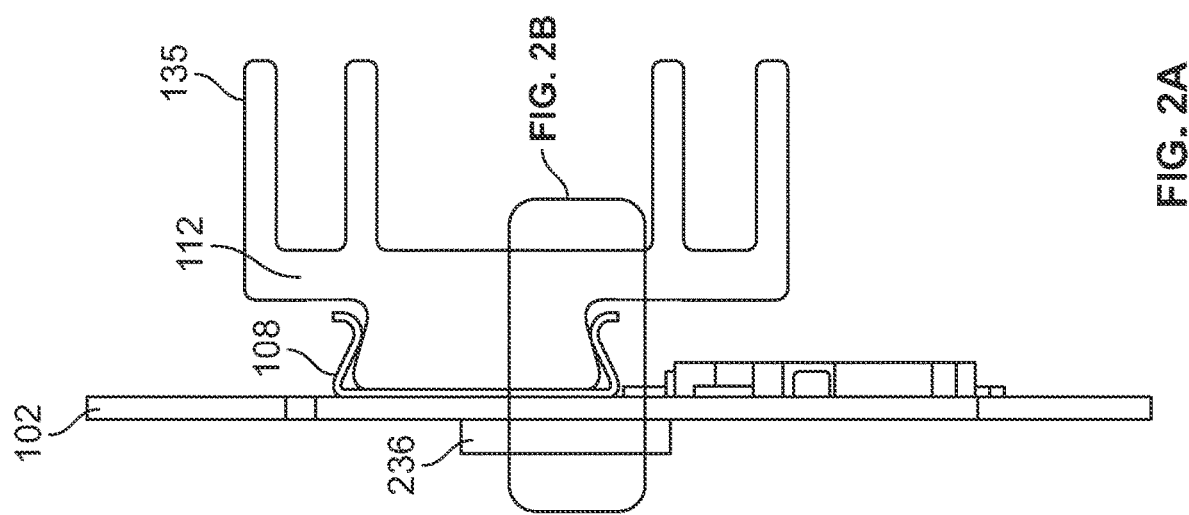
FIG. 2A is a side view of the example circuit board assembly of claim 1, including an electronic device.
Figure 3A:
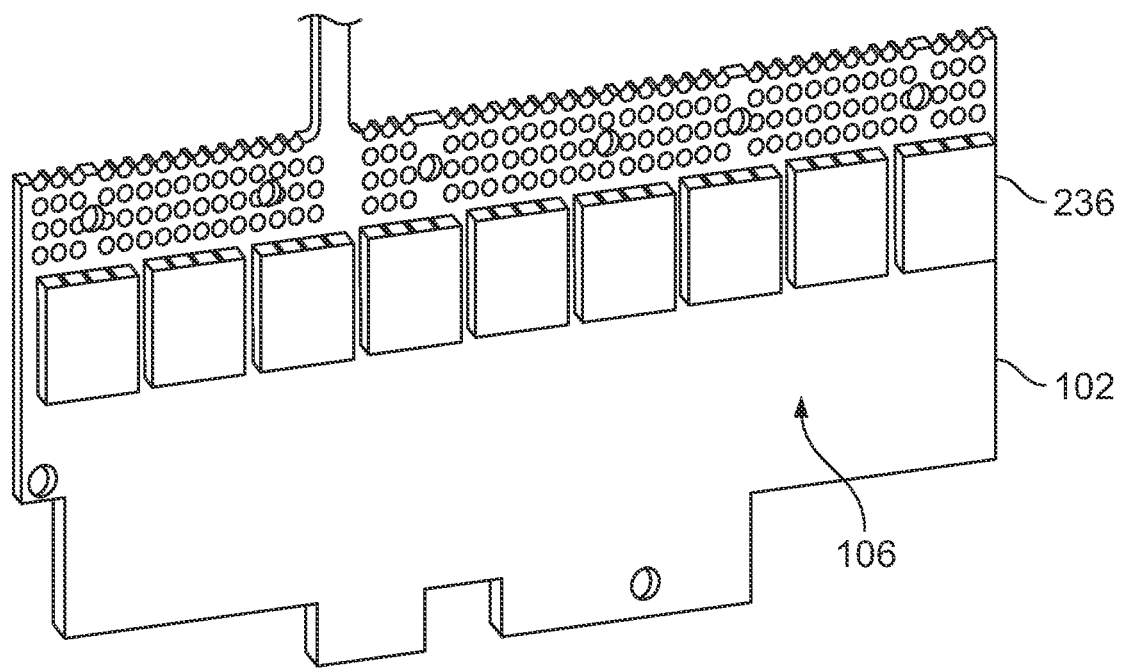
FIG. 3A is an orthogonal view of a side of the circuit board of FIG. 1, including multiple electronic devices.
Figure 3B:
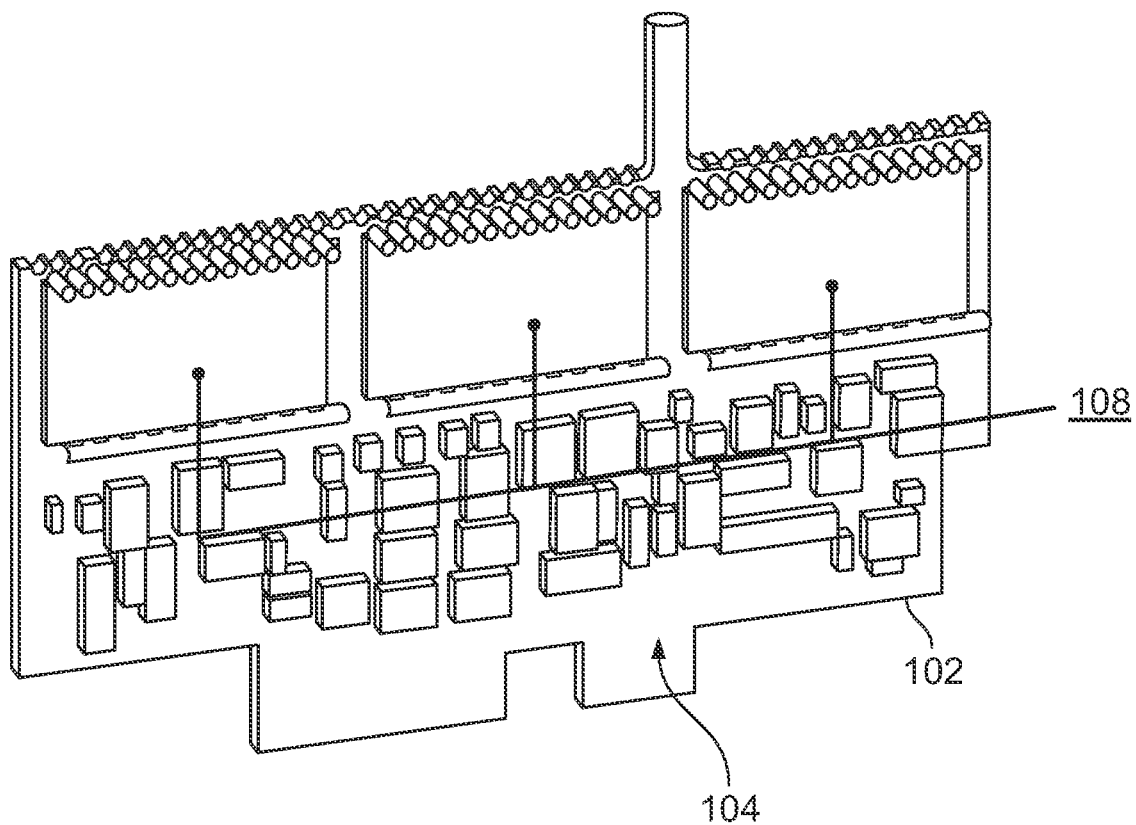
FIG. 3B is an orthogonal view of the opposite side of the circuit board of FIG. 3A, illustrating multiple heat sink carriers.

FIG. 5A is front view of the heat sink carrier of FIG. 1.

FIG. 5B is a side view of the heat sink carrier of FIG. 1.

FIG. 5C is a bottom view of the heat sink carrier of FIG. 1.

FIG. 5D is an orthogonal view of the heat sink carrier of FIG. 1.

Corresponding reference numerals indicate corresponding parts or features throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

A circuit board assembly for electronic devices according to one example embodiment of the present disclosure is illustrated in FIG. 1 and indicated generally by reference number 100. The circuit board assembly 100 includes a circuit board 102 having a first surface 104 and a second surface 106 opposite the first surface 104. A heat sink carrier 108 is disposed on the first surface 104 of the circuit board 102, and the heat sink carrier 108 includes a clamp portion 110.

The assembly 100 also includes a heat sink 112. The heat sink 112 is positioned in the clamp portion 110 of the heat sink carrier 108 to transfer heat from one or more electronic devices (not shown in FIG. 1) to the heat sink 112 via the heat sink carrier 108.

As shown in FIG. 1, the heat sink 112 is sized and shaped to frictionally engage the at clamp portion 110 of the heat sink carrier 108. The clamp portion 110 is sized and shaped to apply a clamping retention force on the heat sink 112 to retain the heat sink 112 in clamp portion 110.

For example, the heat sink 112 may be positioned in the heat sink carrier 108 by moving the heat sink 112 in a direction 114 towards the heat sink carrier 108. Once the heat sink 112 is positioned in the clamp portion 110, the clamp portion 110 applies the clamping retention force on the heat sink 112.

More specifically, the heat sink carrier 108 may include a base 118 positioned to contact the first surface 104 of the circuit board 102, and the clamp portion 110 may include two resilient arms 120 and 122 extending from the base 118 (e.g., the two resilient arms 120 and 122 may extend from opposite edges of the base 118 as shown in FIG. 1, may extend from other locations of the base 118, etc.). The resilient arms 120 and 122 may include any suitable mechanically displaceable material, such as a flexible metal, etc. The resilient arms 120 and 122 may be integral with the base 118 of the heat sink carrier 108. As shown in FIG. 1, each resilient arm 120 and 122 may include a rounded lip at an end of the arm 120 or 122 to facilitate insertion of the heat sink 112, etc.

The two resilient arms 120 and 122 may each extend from the base 118 at an angle 124 of less than ninety degrees (e.g., to facilitate receiving the heat sink 112 between the resilient arms 120 and 122 and retaining the heat sink 112 between the resilient arms 120 and 122 via a frictional clamping retention force). For example, the angle 124 may be less than sixty degrees, between sixty and seventy degrees, about sixty-five degrees, greater than seventy degrees, etc., as desired.

The heat sink 112 may include two surfaces 126 and 128 disposed at an angle 125, for removably coupling the heat sink 112 to the resilient arms 120 and 122 of the heat sink carrier 108. The angle 125 may be different than the angle 124 of the resilient arms 120 and 122 of the heat sink carrier 108. For example, the angle 125 may be less than the angle 124, such as less than ten degrees, between ten and twenty degrees, about fifteen degrees, more than twenty degrees, etc., as desired.

The angle 125 of the two surfaces 126 and 128 of the heat sink 112 may determine a contact pressure between the heat sink 112 and the heat sink carrier 108. Greater angles 125 may correspond to a higher contact pressure of the resilient arms 120 and 122 on the corresponding surfaces 126 and 128 of the heat sink 112, and therefore a lower thermal resistance between the heat sink 112 and the heat sink carrier 108.

In contrast, smaller angles 125 may correspond to a lower contact pressure of the resilient arms 120 and 122 on the corresponding surfaces 126 and 128 of the heat sink 112, and therefore a higher thermal resistance between the heat sink 112 and the heat sink carrier 108.

A clamping force 127 may be applied by the resilient arms 120 and 122 on the corresponding surfaces 126 and 128, and the clamping force 127 may correspond to (e.g., be proportional to) a degree of the angle 124. A normal force 129 towards the mating surface between the heat sink 112 and the heat sink carrier 108 may correspond to (e.g., be proportional to) a degree of the angle 125.

The degrees of the angles 124 and 125 may be selected to provide a desired contact pressure, desired clamping force 127, desired normal force 129, desired thermal resistance, etc., between the heat sink carrier 108 and the heat sink 112.

In FIG. 1, the heat sink 112 includes a body 130 and a coupling member 132 extending from the body 130. The angled surfaces 126 and 128 are part of the coupling member 132, with the coupling member 132 positioned between the resilient arms 120 and 122. In other embodiments, the heat sink 112 may include only the body 130, the body 130 may include the angles surfaces 126 and 128, the body 130 may be positioned between the resilient arms 120 and 122, etc.

In some embodiments, a thermal interface material 134 (e.g., thermal paste, etc.), may be positioned between the heat sink carrier 108 and the heat sink 112. For example, the thermal interface material may be disposed on the base 118 of the heat sink carrier 108 and contact the coupling member 132 of the heat sink 112, to improve heat transfer from the heat sink carrier 108 to the heat sink 112.

The heat sink carrier 108 and the heat sink 112 may include any suitable material(s) for dissipating heat from the circuit board 102, for transferring heat from the circuit board 102 to the heat sink carrier 108, for transferring heat from the heat sink carrier 108 to the heat sink 112, etc. For example, the heat sink carrier 108 may include beryllium copper, the heat sink 112 may include aluminum, etc. The heat sink carrier 108 and the heat sink 112 may have any suitable thermal resistance (e.g., k=66 W/m K, etc.).

The heat sink 112 may include one or more fins 135 extending from the body 130. For example, the fin(s) 135 may extend perpendicular to the body 130, as shown in FIG. 1. The heat sink carrier 108 may not include any fins, to allow for positioning the heat sink 112 in the clamp portion 110 of the heat sink carrier 108. In some embodiments, the heat sink 112 may be positioned in the heat sink carrier 108 without any fasteners or adhesives (the thermal interface material 134 may not be considered as an adhesive, as it may be primarily used to reduce thermal resistance between the heat sink carrier 108 and the heat sink 112, and not to maintain a mechanical coupling of the heat sink 112 to the heat sink carrier 108).

In some embodiments, the heat sink carrier 108 may be disposed on the first surface 104 of the circuit board 102 via a surface mount coupling. For example, the heat sink carrier 108 may be soldered to the first surface 104 via a solder material, to surface mount the heat sink carrier 108 to the first surface 104 of the circuit board 102. In other embodiments, the heat sink carrier 108 may be coupled to the first surface 104 of the circuit board 102 via any other suitable component mounting techniques.

After soldering the heat sink carrier 108 to the circuit board 102 (or otherwise coupling the heat sink carrier to the board 102), the heat sink 112 may be coupled to the heat sink carrier 108 in a "self-locking" manner, where the heat sink 112 is positioned in the heat sink carrier 108 and retained by the clamping retention force of the resilient arms 120 and 122 of the heat sink carrier. The heat sink 112 may be retained in the heat sink carrier 108 without using any adhesives, any fasteners, etc.

As mentioned above, the heat sink carrier 108 may transfer heat from one or more electronic devices to the heat sink 112. FIGS. 2A-B and 3A-B illustrate electronic devices 236 positioned on the second surface 106 of the circuit board 102. The electronic devices 236 may be any suitable electronic devices, such as power converter circuit components, etc., and may generate heat during operation.

For example, a power supply may include the circuit board assembly 100, and a transformer having a primary winding and a secondary winding. Each electronic device 236 may be a field-effect transistor (FET) coupled with the primary winding or the secondary winding, and the heat sink carrier 108 and heat sink 112 can dissipate heat from the FETs 236.

FIGS. 4A-C illustrate different circuit board assemblies each having multiple heat sink carriers and heat sinks, where the heat sinks are different sizes. For example, FIG. 4A illustrates three different sized heat sinks 412A, 412B and 412C, which each have two fins and are each received in a same-sized heat sink carrier 108.

FIG. 4B illustrates three different sized heat sinks 412C, 412D and 412E, which each have different sizes and different numbers of fins, but each are received in a same-sized heat sink carrier 108. FIG. 4C illustrates three different sized heat sinks 412F, 412G and 412H, which each have differently shaped fins, but each are received in a same-sized heat sink carrier 108.

The different sized heat sinks may be positioned in a direction of hot airflow across the opposite side of the circuit board. For example, a heat sink opposite an electronic device positioned at the end of an airflow may need to be larger, to dissipate more heat because the airflow is hotter at the end of the airflow where the corresponding electronic device is located.

FIGS. 5A-5D illustrate example dimensions of the heat sink carrier 108, for purposes of illustration only. Other embodiments may include heat sink carriers having different dimensions.

According to another aspect of the present disclosure, a method of manufacturing a cooling assembly for cooling electronic devices is disclosed. The method includes coupling a heat sink to a first surface of a circuit board. The circuit board has the first surface and a second surface opposite the first surface. The heat sink carrier includes at least one clamp portion. The method also includes positioning a heat sink in the at least one clamp portion of the heat sink carrier, to transfer heat from at least one or more electronic devices to the heat sink via the heat sink carrier. The method may include coupling one or more electronic devices to the second surface opposite the heat sink carrier.

The method may include applying a clamping retention force on the heat sink, by the at least one clamp portion, to retain the heat sink in the at least one clamp portion. For example, the at least one clamp portion may include resilient arms that extend from a base of the heat sink carrier, and the method may include inserting the heat sink between resilient arms of the heat sink carrier. Inserting the heat sink may displace each resilient arm outwards, with the displaced members applying a clamping retention force to the heat sink (e.g., to angled surfaces of the heat sink corresponding to angles of the resilient arms, etc.), to retain the heat sink between the resilient arms of the heat sink carrier.

The method may include positioning a thermal interface material on the heat sink carrier, prior to coupling the heat sink to the heat sink carrier. The heat sink may be positioned in the heat sink carrier without using any fasteners or adhesives. In some embodiments, the heat sink carrier may be soldered to the circuit board via a solder material, to form a surface mount coupling.

The method may include coupling a second heat sink carrier to the first surface of the circuit board opposite at least one of the one or more electronic devices, with the second heat sink carrier including at least one clamp portion. A second heat sink may be positioned in the at least one clamp portion of the second heat sink carrier to transfer heat from at least one of the one or more electronic devices to the second heat sink via the second heat sink carrier. A size of the first heat sink may be different than a size of the second heat sink.

The heat sink carrier and heat sink may comprise any suitable materials. For example, the heat sink may comprise a base and one or more fin members extending perpendicular to the base to dissipate heat from the heat sink, and the heat sink carrier may not include any fin members extending from a base of the heat sink carrier to dissipate heat from the heat sink carrier. In some embodiments, the heat sink carrier may include beryllium copper and the heat sink may include aluminum. In other embodiments, other suitable thermally conductive materials may be used.

According to another example embodiment of the present disclosure, a circuit board assembly for electronic devices includes a circuit board having a first surface and a second surface opposite the first surface, and a heat sink carrier disposed on the first surface of the circuit board.

The heat sink carrier includes a base portion and two resilient arms. The base portion is positioned to contact the first surface of the circuit board, and the base portion includes two opposite edges. The two resilient arms are each located at a different one of the opposite edges. The assembly also includes a heat sink. The heat sink is coupled to the heat sink carrier without any fasteners or adhesives, to transfer heat from one or more electronic devices to the heat sink via the heat sink carrier.

The circuit board assembly may include a thermal interface material positioned between the heat sink carrier and the heat sink. The heat sink carrier may be disposed on the first surface of the circuit board via a surface mount coupling. For example, the circuit board may define multiple openings, and the heat sink carrier may include multiple pins, with each pin positioned in a corresponding one of the multiple openings of the circuit board to surface mount the heat sink carrier to the first surface of the circuit board. In other embodiments, the heat sink carrier may be soldered to the circuit board via a solder material.

In some embodiments, the heat sink carrier is a first heat sink carrier and the heat sink is a first heat sink, and the assembly further includes a second heat sink carrier and a second heat sink. The second heat sink carrier is disposed on the first surface of the circuit board, and the second heat sink carrier includes at least one clamp portion. The second heat sink is positioned in the at least one clamp portion of the second heat sink carrier to transfer heat from one or more electronic devices to the heat sink via the second heat sink carrier. A size of the second heat sink may be different than a size of the first heat sink.

Example embodiments described herein may facilitate use of a same circuit board (e.g., printed circuit board) assembly for applications that use different sized heat sinks for thermal requirements. For example, the circuit board assembly may allow for a same assembly to be used in normal and reversed airflow implementations where larger and smaller sized heat sinks are placed at opposite sides of the circuit board according to the direction of airflow (e.g., one circuit board with multiple heat sink carriers can be used for optionally placing larger heat sinks in heat sink carriers at either end of the circuit board, etc.).

In some embodiments, the assemblies may avoid any in-circuit test (ICT) coverage concerns, because the heat sink carriers and heat sinks may not cover any ICT points for visual ICT inspection. The assemblies may allow for a tool-less process to assemble the circuit boards, heat sink carriers and heat sinks during manufacturing. The heat sinks may be easily replaceable for different applications, for rework, etc., by removing the heat sinks from the clamp portions of the heat sink carriers, and optionally replacing the removed heat sink with a different sized heat sink.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A circuit board assembly comprising:
a circuit board having a first surface;
a heat sink carrier disposed on the first surface and comprising:
  a base abutting the first surface and comprising:
    a first end; and
    a second end opposite the first end;
  a first resilient arm extending from the first end; and
  a second resilient arm extending from the second end; and
a heat sink abutting the base between the first and second resilient arms to transfer heat from one or more electronic devices to the heat sink via the heat sink carrier;
wherein the one or more electronic devices are disposed on a second surface of the circuit board opposite the heat sink carrier.

2. The circuit board assembly of claim 1, wherein the heat sink comprises:
a body; and
a coupling member extending from the body.

3. The circuit board assembly of claim 2, wherein the coupling member is positioned against the base by the first and second resilient arms.

4. The circuit board assembly of claim 3, wherein the coupling member comprises a first surface and a second surface;
wherein the first surface of the coupling member engages the first resilient arm; and
wherein the second surface of the coupling member engages the second resilient arm.

5. The circuit board assembly of claim 4, wherein the first surface of the coupling member is formed at a first angle with respect to the base; and
wherein the first resilient arm extends from the base at a second angle with respect to the base.

6. The circuit board assembly of claim 5, wherein the first angle is larger than the second angle.

7. The circuit board assembly of claim 5, wherein the first and second resilient arms apply a clamping force against the first and second surfaces of the coupling member to bias the heat sink toward the heat sink carrier.

8. The circuit board assembly of claim 5, wherein the first angle is less than ninety degrees.

9. The circuit board assembly of claim 2 further comprising a fin assembly comprising one or more fin members extending from the body.

10. The circuit board assembly of claim 9, wherein the heat sink carrier is a first heat sink carrier and the heat sink is a first heat sink; and
wherein the circuit board assembly further comprises:
  a second heat sink carrier disposed on the first surface of the circuit board, the second heat sink carrier comprising:
    a base coupled to the first surface and comprising:
      a first end; and
      a second end opposite the first end;
    a first resilient arm extending from the first end of the base of the second heat sink carrier; and
    a second resilient arm extending from the second end of the base of the second heat sink carrier; and
  a second heat sink abutting the base of the second heat sink carrier between the first and second resilient arms of the second heat sink carrier.

11. The circuit board assembly of claim 10, wherein the second heat sink comprises:
a body; and
a coupling member extending from the body and positioned against the base of the second heat sink carrier by the first and second resilient arms of the second heat sink carrier.

12. The circuit board assembly of claim 11 further comprising a second fin assembly comprising one or more fin members extending from the base of the second heat sink.

13. The circuit board assembly of claim 12, wherein a size of the fin assembly of the first heat sink is different from a size of the second fin assembly; and
wherein a size of the first heat sink carrier and a size of the second heat sink carrier are the same.

14. The circuit board assembly of claim 1 further comprising a thermal interface material positioned between the heat sink carrier and the heat sink.

15. A method of assembling a circuit board comprising:
coupling a heat sink carrier to a first surface of the circuit board, the heat sink carrier comprising:
a base portion positioned to abut the first surface of the circuit board and comprising two opposite edges; and
two resilient arms, each resilient arm located at a different one of the two opposite edges, wherein the base portion is positioned between the two resilient arms; and
coupling a heat sink to abut the base portion of the heat sink carrier between the two resilient arms without any fasteners or adhesives;
wherein coupling the heat sink carrier to the first surface of the circuit board comprises positioning the heat sink carrier on the first surface opposite an electronic device positioned on a second surface of the circuit board, the second surface opposite the first surface.

16. The method of claim 15 further comprising positioning a thermal interface material between the heat sink carrier and the heat sink.

17. The method of claim 15, wherein coupling the heat sink to the base portion comprises positioning the heat sink against a clamping force exerted by the two resilient arms, the clamping force sufficient to retain the heat sink within the heat sink carrier.

18. The method of claim 17, wherein the heat sink comprises a pair of surfaces disposed at a first angle with respect to the base portion;
wherein the two resilient arms extend from the base portion at a second angle; and
wherein the second angle is smaller than the first angle.

19. A circuit board assembly comprising:
a circuit board having a first surface;
a heat sink carrier disposed on the first surface and comprising:
a base coupled to the first surface and comprising:
a first end; and
a second end opposite the first end;
a first resilient arm extending from the first end; and
a second resilient arm extending from the second end; and
a heat sink abutting the base between the first and second resilient arms to transfer heat from one or more electronic devices to the heat sink via the heat sink carrier;
wherein:
the heat sink comprises:
a body; and
a coupling member extending from the body;
the coupling member is positioned against the base by the first and second resilient arms;
the coupling member comprises a first surface and a second surface;
the first surface of the coupling member engages the first resilient arm;
the second surface of the coupling member engages the second resilient arm
the first surface of the coupling member is formed at a first angle with respect to the base; and
the first resilient arm extends from the base at a second angle with respect to the base.

* * * * *